United States Patent [19]

Kollanyi

[11] Patent Number: 4,757,193
[45] Date of Patent: Jul. 12, 1988

[54] LASER DC BIAS CONTROLLER

[75] Inventor: Miklos J. Kollanyi, Albuquerque, N. Mex.

[73] Assignee: GTE Communication Systems Corporation, Phoenix, Ariz.

[21] Appl. No.: 944,043

[22] Filed: Dec. 22, 1986

[51] Int. Cl.[4] .............................................. H01S 3/10
[52] U.S. Cl. ................................. 250/214 R; 455/610; 455/612; 455/613
[58] Field of Search ..................... 250/214, 205, 227; 455/609, 610, 612, 613

[56] References Cited

U.S. PATENT DOCUMENTS 4,307,469 12/1981 Casper et al. ..................... 455/609
4,553,268 11/1985 Tilly ................................. 455/612

Primary Examiner—Edward P. Westin
Assistant Examiner—Charles Wieland
Attorney, Agent, or Firm—Anthony Miologos

[57] ABSTRACT

A laser DC bias controller is disclosed for controlling and monitoring the laser of a fiber-optic transmitter. The arrangement comprises an optical power monitor including a light detector for converting the light output by the laser into photo current. The photo current is converted by the optical power monitor into a voltage representation of the magnitude of the light output by the laser. The voltage representation is output to a DC constant current source which uses the voltage to provide operating current to the laser of sufficient magnitude to keep the laser operating at a set output level. A transmit data detector monitors the incoming data signals to the fiber optic transmitter and outputs to the optical power monitor a current signal which indicates a failure of the data signal. The optical power monitor converts the current signal to a voltage representation which is output to the DC constant current source. The DC constant current source subsequently turns off the operating current to the laser and an alarm signal representing a failure of the data drive circuit is output to a controller interface. Finally, an optical output detector connected to the optical power monitor is provided to compare the voltage output by the optical power monitor to a set value. When the voltage falls below the set value, the optical output detector sends an alarm signal to the controller interface indicating that the laser has failed.

1 Claim, 2 Drawing Sheets

LASER DC BIAS CONTROLLER

CROSS-REFERENCE TO RELATED APPLICATIONS

The present application is related to the following co-pending U.S. patent applications all having a common assignee:

Ser. No. 867,010 titled, "OPTICAL DETECTOR CIRCUIT";
Ser. No. 867,030, titled, "LASER DRIVER CIRCUIT";
Ser. No. 867,032, titled, "LASER TEMPERATURE CONTROLLER";
Ser. No. 867,033, titled, "LOSS OF OPTICAL INPUT CIRCUIT";

BACKGROUND OF THE INVENTION

This invention relates in general to fiber-optic transmitter arrangements and more specifically to a novel laser controller circuit for a fiber-optic transmitter.

Fiber-optic receivers and transmitters or fiber-optic interface units are used in modern telecommunications and data transmission systems between an optical fiber transmission line and electronic digital equipment. The fiber-optic transmitter receives electrical signals from the electronic equipment representing the data to be transmitted. The transmitter then converts the data to light pulses which are coupled to an optical fiber transmission line. The fiber-optic receiver receives light pulses representing the transmitted data from an optical fiber transmission line and converts the light pulses to electrical signals which are sent to and processed by the electronic digital equipment. These systems work in very high transmission rates from 145Mbs to 2400Mbs (Megabits per second).

Transmission of data or other signals along optical fiber transmission lines have advantage in the fact that light rays are almost immune to electromagnetic interference such as sparks, lightening, crosstalk and other interference which may be induced into the transmission line.

Many fiber-optic transmitters use a high output solid state light emitting device or laser to produce the light pulses used in the transmission of data. The electrical signals received from the electronic equipment are input into a laser drive circuit which modulates the laser producing the light output signals.

In order to prolong the life and the efficiency of a high output laser some means must be provided to shut down the laser in cases where the laser drive fails. Further, it is also advantageous to able to monitor the laser's output and also to detect if the laser has failed.

It therefore becomes an object of the present invention to disclose a novel laser DC bias controller which monitors and controls the operation of the laser of a laser.

SUMMARY OF THE INVENTION

In accomplishing the object of the present invention there is provided an arrangement for controlling and monitoring the light emitting device of a fiber-optic transmitter. The fiber optic transmitter includes, a light emitting device driver circuit for providing operating current to the light emitting device. A data drive circuit provides the light emitting device driver circuit with data to be transmitted by the fiber-optic transmitter.

The arrangement of the present invention comprises a light emitting device monitor means including a light detector for converting the light output by the light emitting device into photo current. A photo current conversion circuit converts the photo current into a voltage representation of the magnitude of the light output by the light emitting device.

The voltage representation output by the photo current conversion circuit is input into a DC constant current means. The DC constant current means provides operating current to the light emitting device driver circuit of sufficient magnitude to keep the light emitting device operating at a set output level.

The arrangement further includes transmit data detector means connected to the data drive circuit. The transmit data detector means outputs to the light emitting device monitor means a current signal which indicates a failure of the data signal. The light emitting device monitor means converts the current signal to a voltage representation which is output to the DC constant current means. The DC constant current means subsequently turns off the operating current to the light emitting device driver circuit. Simultaneously, a signal representing a failure of the data drive circuit is output to a controller means.

Finally, an optical output detector means connected to the light emitting device monitor means is also provided. The optical output detector means is arranged to compare the voltage representation output by the light emitting device monitor means to a set value. When the voltage representation falls below the set value, the optical output detector means sends an alarm to the controller means indicating the light emitting device has failed.

A BRIEF DESCRIPTION OF THE DRAWINGS

A better understanding of the invention may be had from the consideration of the following detailed description taken in conjunction with the accompanying drawings in which.

DESCRIPTION OF THE PREFERRED EMBODIMENT

Figure 1:
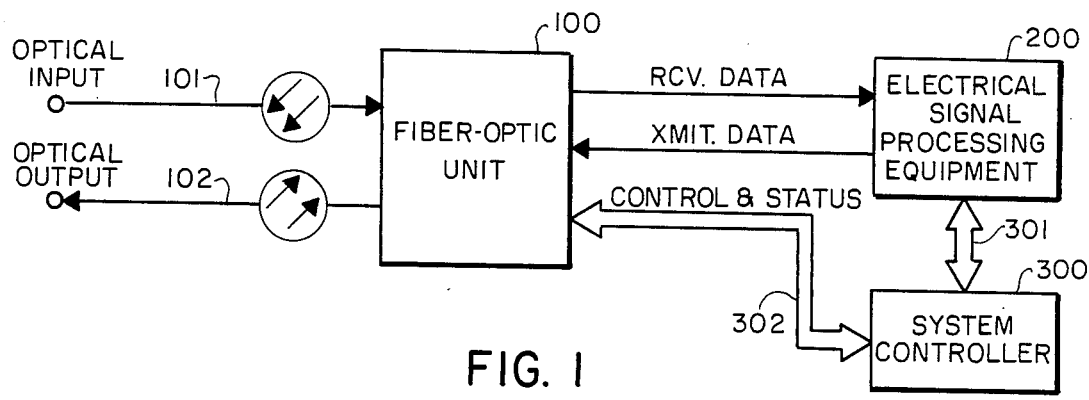
FIG. 1 is a block diagram of illustrating the interconnections of a Fiber-Optic Interface Unit to Electrical Signal Processing Equipment and to a System Controller.

Turning now to FIG. 1 of the included drawings a representation of a system for converting light pulses to electrical signals which uses the optical detector of the present invention is shown. The system shown includes a Fiber Optic Unit (FOU) 100, Electrical Signal Processing Equipment (ESP) 200 and a System Controller (SC) 300.

In the receive path, (data flow away from the optical fiber) a single mode optical fiber light guide is terminated in the FOU 100. The FOU 100 detects the light pulses and converts the received light pulses to electrical pulses. The electrical pulses are amplified and then fed via the RCV DATA line to the ESP 200 equipment where the received data is recovered and used. The ESP 200 equipment can be any digital and/or analog device which can use the recovered data. For example, in telecommunication equipment the ESP equipment can represent a switching system for routing telephone calls from one subscriber to the other. Still in another example the ESP equipment could represent a central computer connected to peripheral terminals via a fiber-optic network.

In the transmit path, (data flow toward the optical fiber) electrical signals in the form of digital pulses are fed to the FOU 100 from the ESP 200 via XMT DATA line. The digital pulses are then passed to a laser driver circuit in the FOU 100 which intensity modulates a solid state laser. The optical energy from the laser is coupled into a single mode optical fiber 102 and transmitted as light pulses down the optical fiber to receiving equipment (not shown). A system control SC 300 receives and sends control and status information from/to the FOU 100. For example, the controller can monitor the FOU to determine if an optical signal is being received in order to signal the ESP 200 that data from the FOU is available, or the SC 300 can receive status information concerning the temperature of the transmitting laser or if it has failed.

Figure 2:
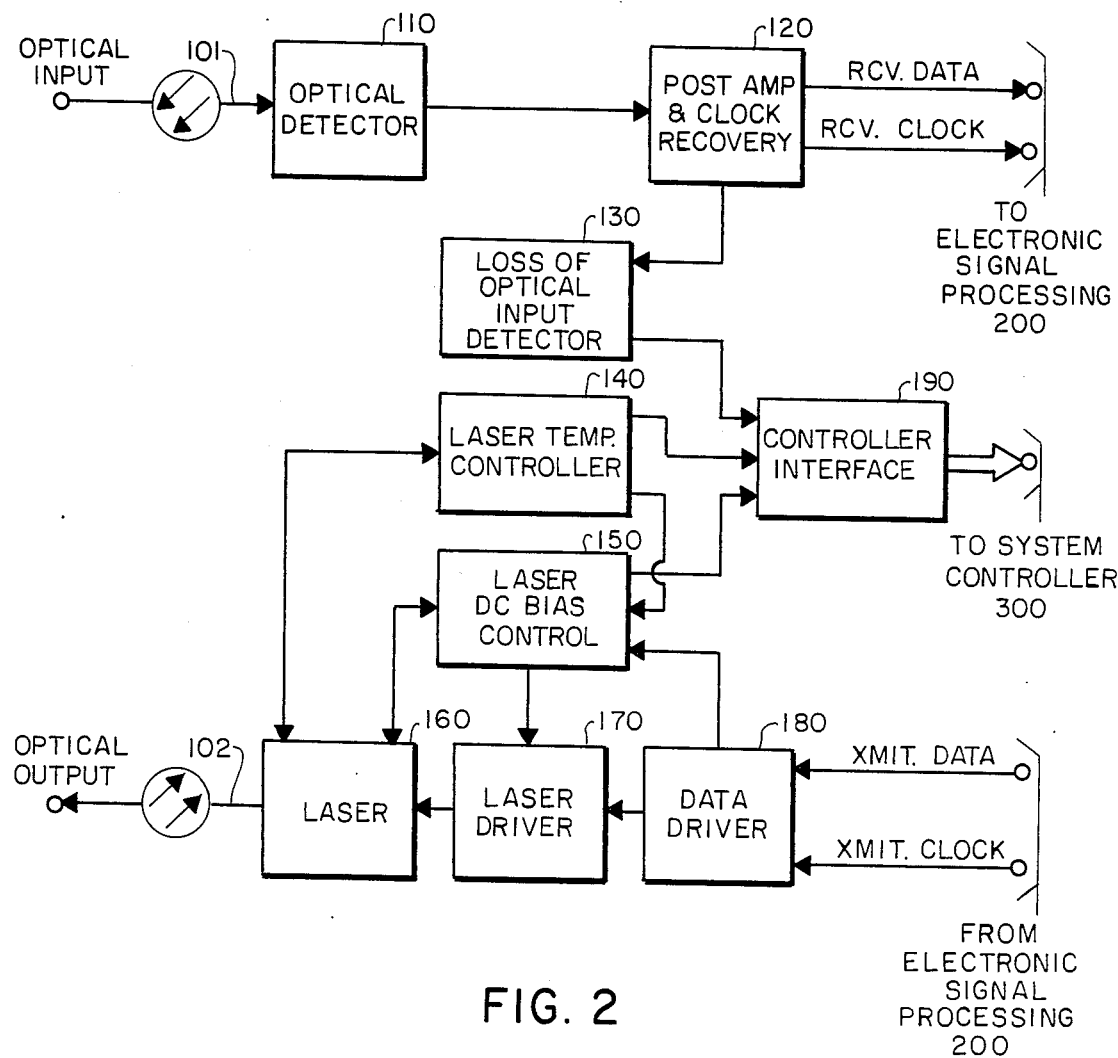
FIG. 2 is block diagram detailing the structure of the Fiber-Optic Unit and including the optical detector of the present invention.

Turning now to FIG. 2 a description and explanation of the operation of the FOU 100 of the above described system will now be given. In the receive path, the Optical Fiber input 101 is input to an Optical Detector 110. The Optical Detector converts the optical energy into electrical signals and then amplifies the received signals.

The amplified electrical signals are passed to a Post Amp & Clock Recovery Circuit 120 where they are further amplified and a clock signal is extracted from the input electrical signal. The extracted clock is reclocked and the data and clock are passed on to the ESP 200 via the RCV. DATA line and RCV. CLOCK line respectively.

A Loss of Optical Input Detector 130 is connected to the Post Amp & Clock Recovery Circuit. The Loss of Optical input Detector 130 is arranged to send an alarm signal to a Controller Interface 190 whenever the optical input level drops below a preset threshold. The Controller Interface 190 then outputs the alarm to the SC 300.

In the transmit path, electrical signals in the form of digital pulses and a clock signal are input to the Data Driver 180 from the ESP 200 on lines XMT. DATA and XMT. CLOCK respectively. The Data Driver reclocks the data transmitted from ESP 200 using the XMT. CLOCK signal. The output of the Data Driver 180 is sent to the Laser Driver circuit 170 which in turn modulates Laser 160 converting the input electrical signals to an optical signal. The Lasers light output is coupled into a single mode fiber and transmitted out on Optical Output 102.

The Transmit path further includes a Laser DC Bias Control arranged to turn off the Laser 160 in case the data drive fails. This prevents the Laser from being continuously turned on.

A Laser Temperature Controller 140 is also included and used to control the laser's temperature and also the optical output level. Both the Laser temperature controller 140 and Laser DC Bias Control 150 send alarm signals to the Controller Interface 190 in the event that the laser has failed, its temperature is out of limits, or the Data Drive circuit has failed.

Figure 3:
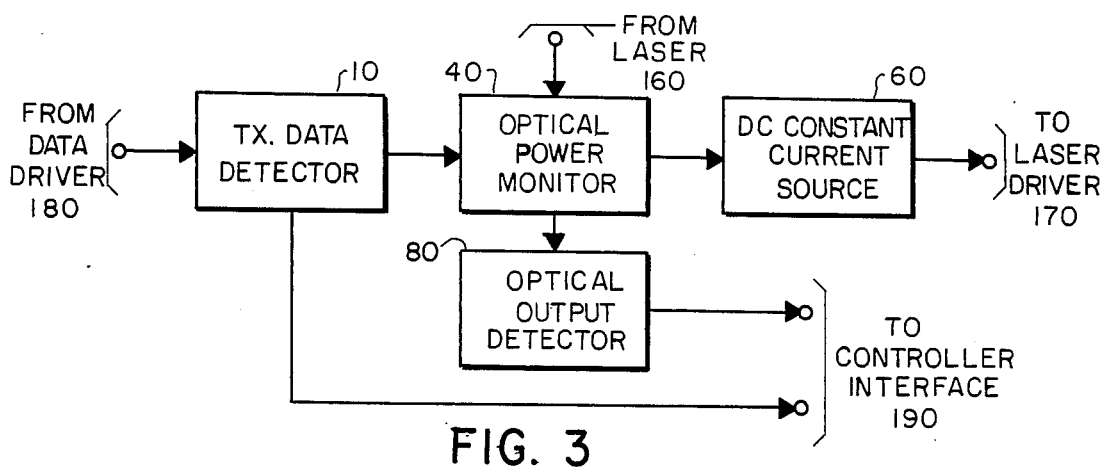
FIG. 3 is detailed schematic of the laser DC bias controller of the present invention.

Turning now to FIG. 3 a description of the laser DC bias controller 160 of the present invention will now be given. The controller includes a Transmit Data Detector (TDD) 10 which receives a signal from the data driver 180. A detected failure of the data drive signal will cause an output signal to be sent to the Optical Power Monitor (OPM) 40 which in turn will cause the DC Constant Current Source (CCS) 60 to shut down. This cuts off the drive current to the laser driver and laser 190. An alarm signal is also developed in the TDD 10 which is sent to the controller interface 190 to signal the failure.

A photodetector included in the laser 190 provides a signal to the OPM 40. The light output by the laser emitter is monitored by OPM 40 which sends signals to the constant current source 60. The DC current output of the CCS 60 is controlled to provide a constant optical output level.

Finally, the OPM 40 also provides a signal to an Optical Output Detector (OOD) 80. When the laser 160 fails and produces no optical output the OOD 80 develops an alarm signal which it outputs to the controller interface 190.

Figure 4:
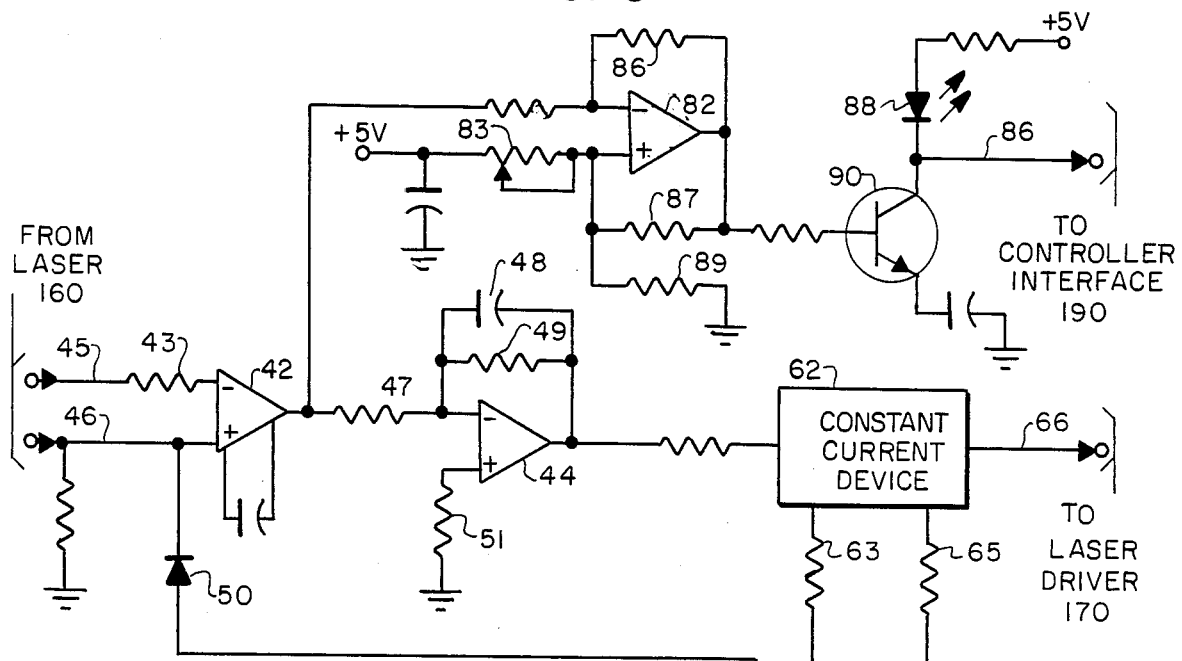
FIG. 4 is detailed schematic of the device shown in FIG. 3.

Turning now to FIG. 4 a detailed schematic of the Laser DC bias controller of the present invention is shown. The TDD 10 receives a signal in the form of DC current from the Data Driver circuit 180 via input line 18 and resistor 13. The DC current is applied to the negative input of operational amplifier 12. Capacitor 16 and resistor 15 set the operating characteristics of amplifier 12. The output of amplifier 12 is connected to the negative input of operational amplifier 14 via resistor 17, where it is further amplified and inverted. The output of amplifier 14 is a DC current which is applied to the positive input of operational amplifier 42 of the OPM 40 via a current rectifier 50.

When the Data Driver 180 stops providing current to TDD 10 due to the AC drive of the data driver 180 failing, a DC current will be provided by amplifier 14 to transistor 20 and to the positive input of operational amplifier 42 via current rectifier 50. As a result, OPM 40 then shuts down the constant current device 62. The loss of the DC current output of amplifier 14 allows a positive voltage to be felt at the base of transistor 20. This turns on transistor 20 causing light emitting diode (LED) 11 to turn on and a negative logic level alarm signal to be sent to the controller interface 190 via line 24. The alarm signals that the AC drive for the laser has failed.

The OPM 40 of the present invention receives photo current via leads 45, 46 from a photodetector which is illuminated by the backfacet of laser 160. The photo current is input into operational amplifier 42 which converts the photo current to voltage. The output of amplifier 42 is applied to the negative input of operational amplifier 44 via resistor 47 where it is amplified and inverted. Capacitor 48 and resistor 49 set the operating characteristics of amplifier 44. The output voltage from amplifier 44 is input to the constant current device 62 of the CCS 60. Device 62 along with resistors 63, 67 and 65, 69 comprise a DC constant current source which supplies drive current for the laser driver circuit 170 via lead 66.

The voltage output from amplifier 42 is also applied to the negative input of operational amplifier 82 of the OOD 80. Amplifier 82 is configured by resistors 86, 87 and 89 to operate as a comparator with hysteresis. With the negative input of amplifier 82 more positive than a set reference voltage at the positive input (set by variable resistor 83) a negative output is generated by the amplifier 82 turning transistor 90 off.

When the output of amplifier 42 goes more negative than the positive input of amplifier 82 (due to laser failure), the output of amplifier 82 goes positive biasing transistor 90 on. This turns on LED 88, and also provides a negative logic level signal via line 86 to the controller interface 190, indicating that the laser 160 has failed.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. An arrangement for controlling and monitoring the light emitting device of a fiber-optic transmitter, said arrangement comprising:

light emitting device monitor means including a light detector for converting the light output by said light emitting device into photo current, and photo current conversion means for converting said photo current into a voltage representation of the magnitude of light output by said light emitting device;

DC constant current means connected to said light emitting device monitor means, said DC constant current means receives said voltage representation output by said conversion means and outputs operating current of sufficient magnitude to keep said light emitting device operating at a set output level;

transmit data detector means arranged to provide to said light emitting device monitor means a current signal indicating a data signal failure, said light emitting device monitor means converts said current signal to said voltage representation whereby, said voltage representation is output to said DC constant current means, turning off said DC constant current means and simultaneously providing a controller means with a signal representing a data signal failure; and, optical output detector means connected to said light emitting device monitor means, said optical output detector means arranged to compare the voltage representation output from said light emitting device monitor means to a set value, whereby, said optical output detector means sends an alarm to said controller means indicating said light emitting device has failed when said voltage representation falls below said set value.

* * * * *